(12) United States Patent
Ballini

(10) Patent No.: US 12,323,166 B2
(45) Date of Patent: Jun. 3, 2025

(54) GLITCH-FREE ZERO-LATENCY AGC FOR SIGMA DELTA MODULATOR

(71) Applicant: INVENSENSE, INC., San Jose, CA (US)

(72) Inventor: Marco Ballini, Assago (IT)

(73) Assignee: INVENSENSE, INC., San Jose, CA (US)

( * ) Notice: Subject to any disclaimer, the term of this patent is extended or adjusted under 35 U.S.C. 154(b) by 217 days.

(21) Appl. No.: 18/343,151

(22) Filed: Jun. 28, 2023

(65) Prior Publication Data

US 2024/0022258 A1 Jan. 18, 2024

Related U.S. Application Data

(60) Provisional application No. 63/356,529, filed on Jun. 29, 2022.

(51) Int. Cl.
*H03M 3/00* (2006.01)

(52) U.S. Cl.
CPC ........... *H03M 3/486* (2013.01); *H03M 3/376* (2013.01); *H03M 3/464* (2013.01); *H03M 3/488* (2013.01); *H03M 3/49* (2013.01); *H03M 3/422* (2013.01); *H03M 3/438* (2013.01); *H03M 3/45* (2013.01); *H03M 3/454* (2013.01); *H03M 3/458* (2013.01)

(58) Field of Classification Search
CPC ........ H03M 3/486; H03M 3/464; H03M 3/49; H03M 3/422; H03M 3/376; H03M 3/488; H03M 3/438; H03M 3/45; H03M 3/454; H03M 3/458
USPC ........................................................ 341/143
See application file for complete search history.

(56) References Cited

U.S. PATENT DOCUMENTS 6,489,907 B2 * 12/2002 Cusinato ............... H03M 3/364
                                                        341/200
9,425,817 B1 *  8/2016 Melanson ............. H03M 3/464

* cited by examiner

*Primary Examiner* — Khai M Nguyen
(74) *Attorney, Agent, or Firm* — Amin, Turocy & Watson, LLP

(57) ABSTRACT

A system, comprising: a sigma-delta modulator using an integrator of a cascade-of-integrator feedback topology to perform operations is disclosed. The operations can comprise in response to receiving a gain value, applying the gain value to a group of feed-forward coefficients, determining a change in the gain value, and adjusting, during a clock cycle of a defined time period, a plurality of state variables of the sigma-delta modulator by multiplying each of the state variables by the scale factor that is a ratio of the gain value after determining the change in the gain value the gain value before determining the change in the gain value.

10 Claims, 12 Drawing Sheets

GLITCH-FREE ZERO-LATENCY AGC FOR SIGMA DELTA MODULATOR

CROSS REFERENCE TO RELATED APPLICATIONS

This application claims priority to U.S. Provisional Patent Application Ser. No. 63/356,529, titled: "GLITCH-FREE ZERO-LATENCY AGC FOR SIGMA DELTA MODULATOR," filed Jun. 29, 2022, the disclosure of which is hereby incorporated herein by reference in its entirety.

TECHNICAL FIELD

The subject disclosure relates to glitch-free zero-latency automatic gain correction (AGC) for sigma delta modulators.

BACKGROUND

Automatic gain correction (AGC) in analog-to-digital converters (ADC) can be subject to glitches (e.g., transitional spikes in a waveform) that can occur during gain transitions. Glitches in the audible spectrum can be perceived as transitory hiss, clicks, and/or crackles in the audible waveform. In attempts to remove glitches, glitch removal (GREM) functionalities have been implemented to moderate success. Nevertheless, removing and/or compensating for glitches can be difficult and currently small residual glitches have remained and are still detectable. Further, utilization of GREM can introduce latencies since GREM generally uses a low-pass filter, which can be a trade-off for effectiveness in glitch suppression. Additionally, glitches can have some performance dependencies in the context of process, voltage, and temperature (PVT) variations and/or a capacitor's matching (through signal transfer function (STF) response), and as such the effectiveness of GREM can vary with PVT and/or capacitor matching.

SUMMARY

The following presents a simplified summary of the invention to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with various embodiments set forth herein, the subject disclosure provides a system comprising a sigma-delta modulator that employs an integrator of a cascade-of-integrator feedback topology to perform operations. The operations can comprise, in response to receiving a gain value, applying the gain value to a group of feed-forward coefficients and to a digital output of the sigma-delta modulator, determining a change in the gain value, and, adjusting, during a clock cycle of a defined time period, a plurality of state variables of the sigma-delta modulator by multiplying each state variable of the plurality of state variables by a scale factor representing a ratio of the gain value after determining the change in the gain value and the gain value before determining the change in the gain value.

In relation to the foregoing, the sigma-delta modulator can be a discrete-time system, and the integrator of the cascade-of-integrator feedback topology can be implemented using switched-capacitor circuits. Additionally, the gain value of the sigma-delta modulator can be varied as a function of changing capacitor values input to switched-capacitor inputs supplied to switched-capacitor circuits.

Further operations can comprise in response to a decrease in the gain value, the plurality of state variables can be reduced by the scale factor, during a single clock cycle, as a function of discharging a defined amount of charge associated with each feedback capacitor.

In the foregoing the charge associated with the feedback capacitor can be decreased by splitting a capacitance associated with the feedback capacitor into a first feedback capacitor and a second feedback capacitor, wherein the first feedback capacitor can be discharged during the single clock cycle.

Additional operations can include in response to an increase in the gain value, the plurality of state variables can be increased by the scale factor, during a single clock cycle, as a function of increasing the charge associated with each feedback capacitors, and the charge associated with the feedback capacitor of each integrator can be increased by sampling a group of values output by the integrator of the cascade-of-integrator feedback topology, wherein a value of the group of values corresponds to the plurality of state variables, and wherein a charge proportional to a sample to the sampling of the group of values can be injected to the feedback capacitor.

Concerning the above, an analog input signal input to the sigma-delta modulator can be generated by a microelectromechanical sensor device, additionally and/or alternatively, an analog input signal is input to the sigma-delta modulator is generated by a microelectromechanical microphone device.

In regard to the foregoing, an analog input signal input to the sigma-delta modulator can be generated by a microelectromechanical sensor device. Also, an analog input signal input to the sigma-delta modulator can be generated by a microelectromechanical microphone device.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present disclosure will be apparent upon consideration of the following detailed description, taken in conjunction with the accompanying drawings, in which like reference characters refer to like parts throughout, and in which.

DETAILED DESCRIPTION

Figure 1:
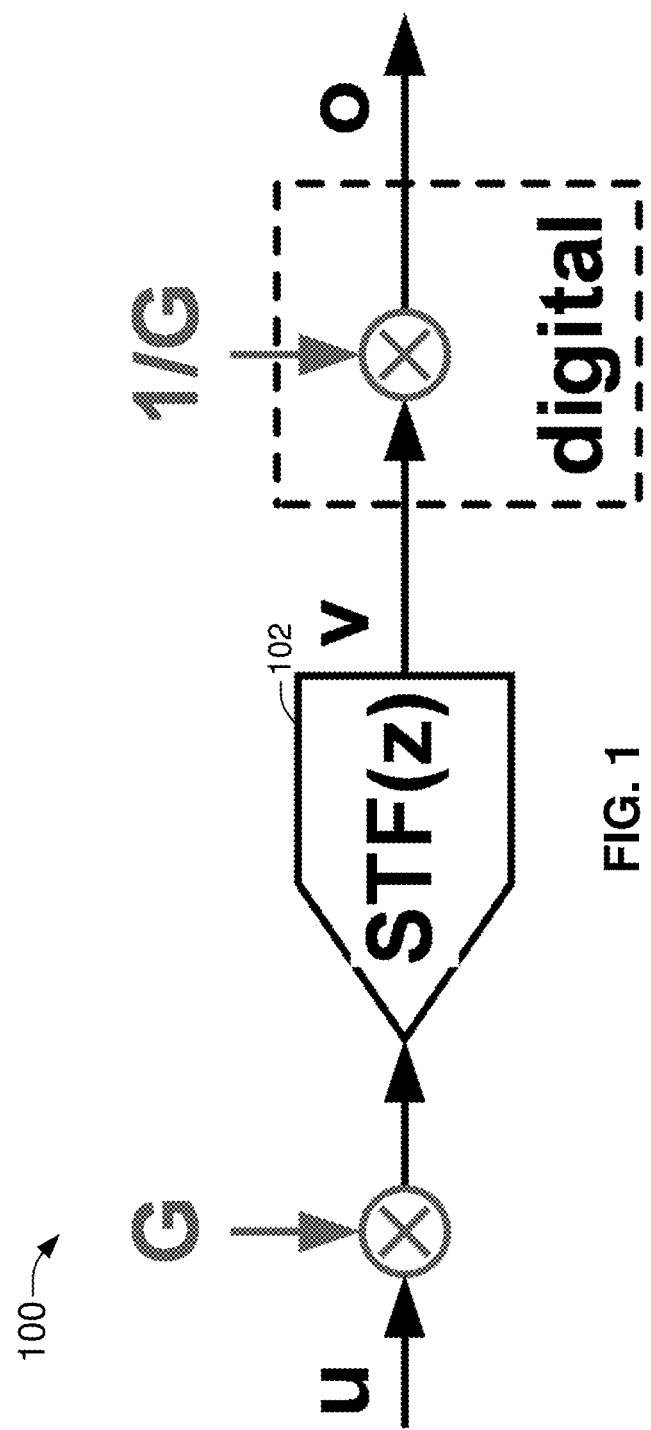
FIG. 1 provides a high-level depiction of an analog to digital converter with input gain values that vary over time, in accordance with various embodiments set forth in this disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details. In other instances, well-known structures and devices are shown in block diagram form in order to facilitate describing the embodiments in additional detail.

The disclosed and described embodiments set forth herein provide an analog approach to avoid having glitches when changing gain of a sigma delta analog to digital converter (IA ADC). The disclosed and described approach, in various embodiments, can be based on an understanding that glitches can be caused by a mismatch between a step of the signal injected into a modulator/integrator (e.g., caused by a change in gain value) and an inverse of the gain value applied at an output of the modulator/integrator. Based on the foregoing understanding, the basic concept of the subject disclosure is to adjust state variables (e.g., integrator outputs stored at feedback capacitors), when gain changes. Concerning reference to a "step" as used in this disclosure refers generally to a time step in a time sequence.

With reference to FIG. 1 and in accordance with various embodiments, illustrated therein is a high level depiction of an analog to digital converter (ADC) 100 wherein an analog signal (u) can be associated (e.g., in this instance multiplied) with an input gain value G. The value of input gain value (G) can vary over time through a defined number of steps. The gain value (G) can be applied at the input stages of ADC 100. A higher gain value (G) can be used for signals with small amplitude in order to increase the signal to noise ratio (SNR) of the ADC 100. The output digital signal can be multiplied by the inverse of the gain value G (e.g., 1/G), so that the digitized signal (v) does not show any apparent variations apart from a change in ADC noise.

The response of a sigma-delta ADC 100 generally can be approximated by a linear transfer-function (e.g., a signal transfer function (STF) 102, which for a cascade of integrator feedback (CIFB) implementations can have a low-pass filter response. Since a step in the input signal (u) caused by a change in gain value (G) can typically be filtered through use of the STF 102, a transient glitch in a digital output (o) can be obviated by multiplying the output of the STF 102 (e.g., output v) by a value that is the inverse of the gain value (G)—the inverse of the gain value (G) can be represented as 1/G.

Other structures, such as cascade of integrator feed forward (CIFF) implementations, in contrast to cascade of integrator feed-back (CIFB) implementations, generally do not have a low-pass filter response, and typically are less susceptible to the issues concerning glitches.

It should be observed that while the disclosure presents modulators with a certain modulator order for simplicity of explication, other modulator orders can be used to practice the implementations described in this disclosure.

Figure 2:
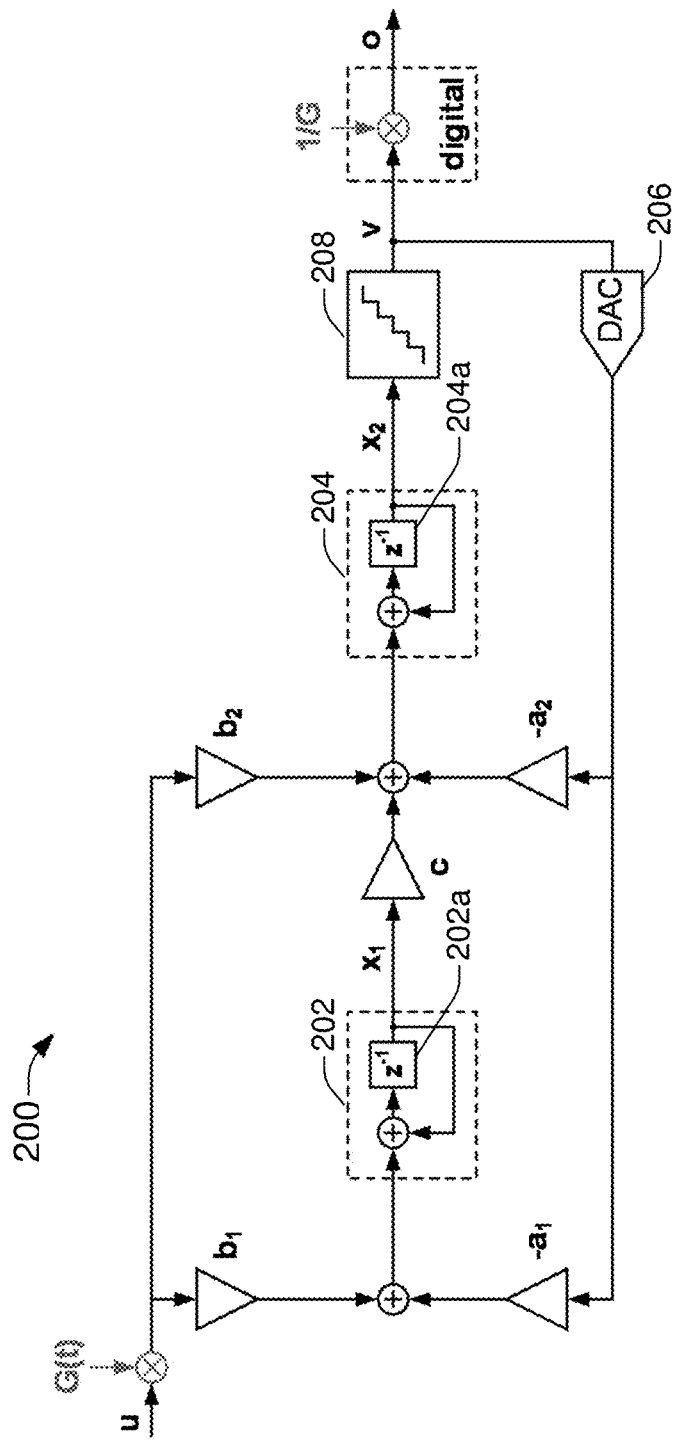
FIG. 2 illustrates a second-order cascade of integrator feedback sigma-delta modulator, in accordance with various embodiments set forth in this disclosure.

With reference to FIG. 2, illustrated therein is a representation of a second order CIFB sigma-delta modulator 200 with varying input-gain and output gain compensation in accordance with various embodiments. As illustrated in relation to second order CIFB sigma-delta modulator 200, an input analog signal (u) can be multiplied by a gain value (G) (e.g., G(t)), the result of this operation can be represented as u×G. Thereafter, u×G can respectively be multiplied by a first feed-forward coefficient value ($b_1$) and a second feed-forward coefficient value ($b_2$). The result of the multiplication of u×G with the first feed-forward coefficient value ($b_1$) can be represented as (u×G×$b_1$). Similarly, the result of the multiplication of u×G with the second feed-forward coefficient value ($b_2$) can be represented as (u×G×$b_2$). The respective operations (u×G×$b_1$) and (u×G×$b_2$) can be performed contemporaneously, and/or in near contemporaneity, with each other. In addition, the use of a sequence of multiplication operators (e.g., (u×G×$b_2$)) is but one way of modifying the values set forth in this disclosure.

The result of the operation (u×G×$b_1$) can be added to a first feed-back coefficient (–$a_1$) value. The first feed-back coefficient (–$a_1$) value can be a first digital to analog conversion value received from digital to analog converter (DAC) 206. The result of the foregoing group of operations can be represented as $((u \times G \times b_1) - a_1)$, and can form a first integrator input value that can be supplied to a first integrator circuit 202. First integrator circuit 202 can comprise a first memory element 202a that can be used to introduce a first determined value from a previous iteration of the first memory element 202a and sum the first determined value from the previous iteration of the first memory element 202a with the first integrator input value (e.g., $((u \times G \times b_1) - a_1)$). The result of the foregoing operations can be output as a first integrator value $(x_1)$. The first integrator value $(x_1)$ can thereafter be multiplied by a constant coefficient value (c). The first integrator value $(x_1)$ multiplied by the constant coefficient value (c) can comprise a first partial input value that can be conveyed to a second integrator circuit 204. With regard to the first integrator value $(x_1)$ this value can be representative of a first state value.

As noted above, the respective operations $(u \times G \times b_1)$ and $(u \times G \times b_2)$ can be performed simultaneously, and/or at a substantially proximate time with each other. Similarly, concurrently, in parallel, and/or concomitantly, with the determination of the first partial input value, a second partial input value can be determined by adding a second feed-back coefficient $(-a_2)$ value to the result of the operation $(u \times G \times b_2)$. Nevertheless, in some implementations there can be a delay of approximately half a clock cycle between the determination of the first partial input value and the second partial input value. The half clock cycle delay can be the result of the first integrator performing a first integrator function (e.g., integrating function) while the second integrator is performing a second integrator function (e.g., sampling function). At this juncture of time, the first partial input value (e.g., $(((u \times G \times b_1) - a_1) \times c))$ and the second partial value (e.g., $((u \times G \times b_2) - a_2))$ can be added (or summed) together, and thereafter can be forwarded to second integrator circuit 204 as a second integrator input value. Concerning the second feed-back coefficient $(-a_2)$ value, like the first feed-back coefficient $(-a_1)$ value, the second feed-back coefficient $(-a_2)$ value can be a second digital to analog conversion value received from the DAC 206. It should be noted that the summing of the first and second partial input values can be performed during an integration phase of each integration. Similarly, regarding the summing of the DAC values, each integrator can perform the addition of these values during an integration phase.

Second integrator circuit 204 can be configured and operate in a manner similar to that described in the context of the first integrator circuit 202. The second integrator circuit 204 can therefore comprise a second memory element 204a that can be used to introduce a second determined value from a previous iteration of the second memory element 204a and sum the second determined value from the previous iteration of the second memory element 204a with the second integrator input value. The result of the foregoing operations can be output as a second integrator value $(x_2)$. It should be noted in reference to the first memory element 202a and second memory element 204a that the respective values for $z^{-1}$ can represent a time delay in a z-domain, and, in some implementations, first memory element 202a and second memory element 204a can be representative of a feedback capacitor that holds a charge.

Once the second integrator circuit 204 has output the second integrator value $(x_2)$, the second integrator value $(x_2)$ can be supplied to quantizer circuit 208 which can then produce a quantizer output result (v). The quantizer output result can then be fed back to DAC 206. Additionally, once the quantizer output result (v) has been fed back to DAC 206 to provide the first feedback coefficient $(-a_1)$ and the second feedback coefficient $(-a_2)$, the quantizer output result (v) can be multiplied by the inverse of the gain value (1/G) to produce a digital representation of the analog input signal (u). The digital representation of the analog input signal (u) can be represented as digital output signal (o).

Figure 3:
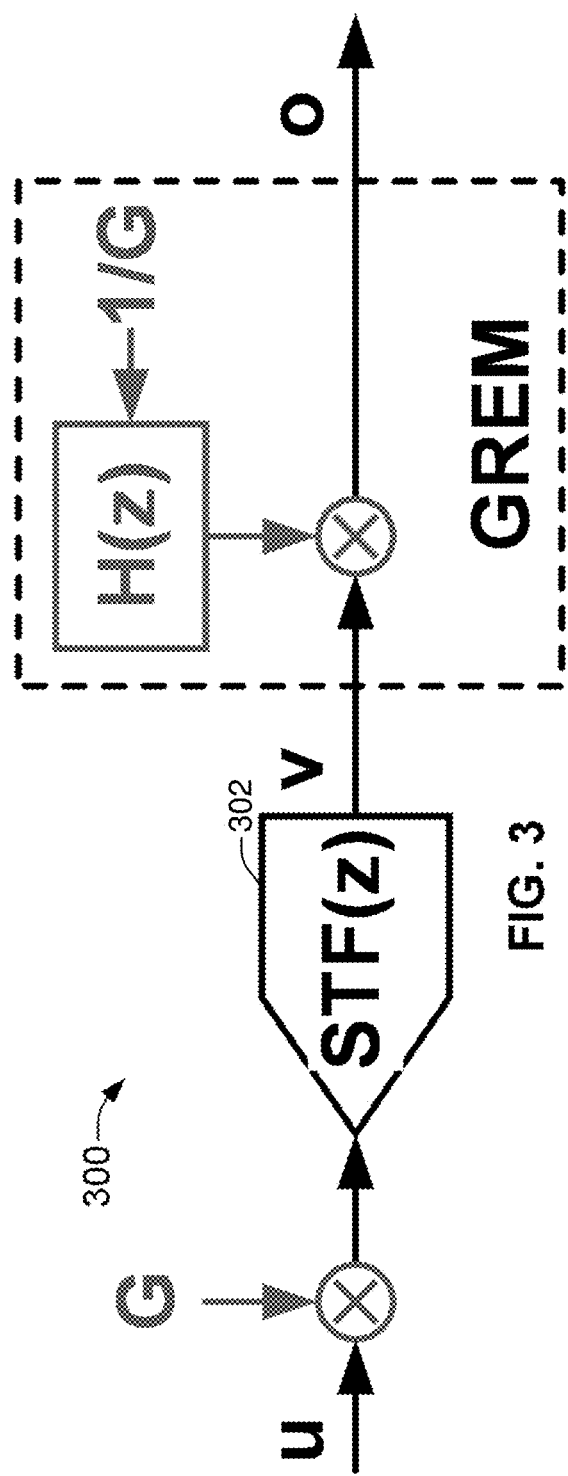
FIG. 3 illustrates an analog to digital converter with variable gain and glitch removal, in accordance with various embodiments set forth in this disclosure.

Now with reference to FIG. 3, depicted therein is a high-level representation of an ADC 300 with variable gain and glitch removal (GREM) in accordance with various embodiments. Similar to ADC 100 depicted in FIG. 1, ADC 300 can receive an analog input signal (u) that has been multiplied by a gain value (G). As observed earlier with regard to FIG. 1, the value of the input gain value (G) can vary over time through a defined number of steps. Moreover, as illustrated in FIG. 3, the gain value (G) can be applied at the input stages of the ADC 300. Further, as also noted in the context of ADC 100, the response of ADC 300 can be approximated by a linear transfer-function, such as STF 302. The output of STF 302, input (v), can be fed into a glitch removal block 304, where the digital output (o) can be varied through a sequence of values so that the value of the function H(z) 304a matches the value of the inverse of the output of STF 302. Due to mismatches between the STF 302, implemented with analog circuits and subject to process voltage, and time (PVT) variations and the function H(z) 304a, implemented with digital circuits, residual glitches can still occur. While calibration of the function H(z) 304a can be implemented, such implementation would generally be at the cost of further increase of the digital implementation of the function H(z) 304a.

Figure 4:
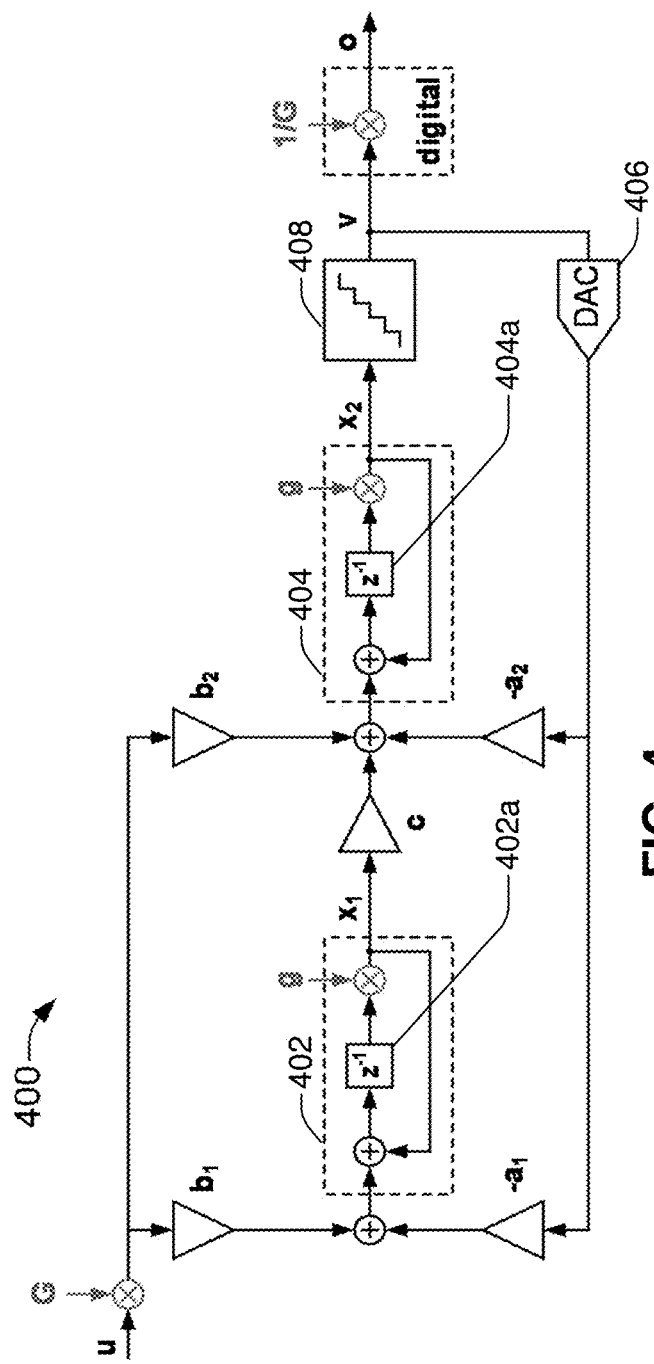
FIG. 4 illustrates an additional second-order cascade of integrator feedback sigma-delta modulator, in accordance with various embodiment set forth in this disclosure.

In reference to FIG. 4, depicted therein is a second order CIFB sigma-delta modulator 400 in accordance with various embodiments. The functionality of second order CIFB sigma-delta modulator 400 can be similar to that described in relation to the second order CIFB sigma-delta modulator 200 and detailed in the context of FIG. 2, and as such for the sake of brevity of exposition has been omitted. Nevertheless while there are certain similarities between second order CIFB sigma-delta modulator 200 and second order CIFB sigma-delta modulator 400, the distinction in the context of second order CIFB sigma-delta modulator 400 lies in the fact that the values of the respective state variables (e.g., $x_1$ and $x_2$) can be modified during one clock cycle based on the gain change. By modifying the values of the respective state variables during one clock cycle, glitches can be reduced and/or removed at the point at which gain changes occur.

In order to achieve the reduction and/or removal of glitches when gain changes occur, the integrator circuits 402 and 404 can be modified, wherein a scaling factor (g) can respectively be injected into each of the integrator circuits 402 and 404. Thus, in relation to 402, in response to receiving the first integrator input value representing $((u \times G \times b_1) + -a_1)$ the first memory element 402a sums a first determined value from a previous iteration of the first memory element 402a with the first integrator input value producing a first intermediate result. The first intermediate result can then be multiplied with the scaling factor (g) to generate a first integrator value $(x_1)$ which in turn can be multiplied by the constant coefficient value (c) which yields the first partial input value that can be forwarded to the second integrator circuit 404. With regard to the scaling factor (g), this can be determined based at least in part on the following equation:

$$g(t) = \frac{G(t)}{G(t - T_s)}$$

where $T_s$ represents a period of a clock cycle, and G(t) is a measured gain at time step (t).

Once the first partial input value has been generated, or in near contemporaneity with the generation of the first partial input value, a second partial input value can have been generated. The second partial input value can be generated in a similar manner as that described in relation to FIG. 2—adding a second feed-back coefficient ($-a_2$) value to the result of the operation $(u \times G) \times b_2$. On completion of producing the second partial input value, the first partial input value can be added to the second partial input value to form the second integrator input value.

The second integrator circuit 404, like the first integrator circuit 402, can comprise a second memory element 404a that can add a second determined value from a previous iteration of the second memory element 404a with the second integrator input value producing a second intermediate result. The second intermediate result can then be multiplied with the scaling factor (g) to generate a second integrator value ($x_2$).

As noted in regard to FIG. 2, the second integrator value ($x_2$) can serve as an input to quantizer circuit 408 which can produce a quantizer output result (v). The quantizer output result (v) can then be fed back to a digital to analog converter 406. Further the quantizer output result (v) can be multiplied by the inverse gain value (1/G) to produce a digital representation (o) of the input analog signal (u).

In order to achieve a glitch free AGC, glitch free AGC can be based on an understanding that changing quantizer resolution generally does not introduce glitches. The foregoing understanding can be based, for example, because in a noise transfer function (NTF) (e.g., a transfer function from quantizer input to modulator output) in some instances may not provide a (strong) low-pass filter action.

Figure 5:
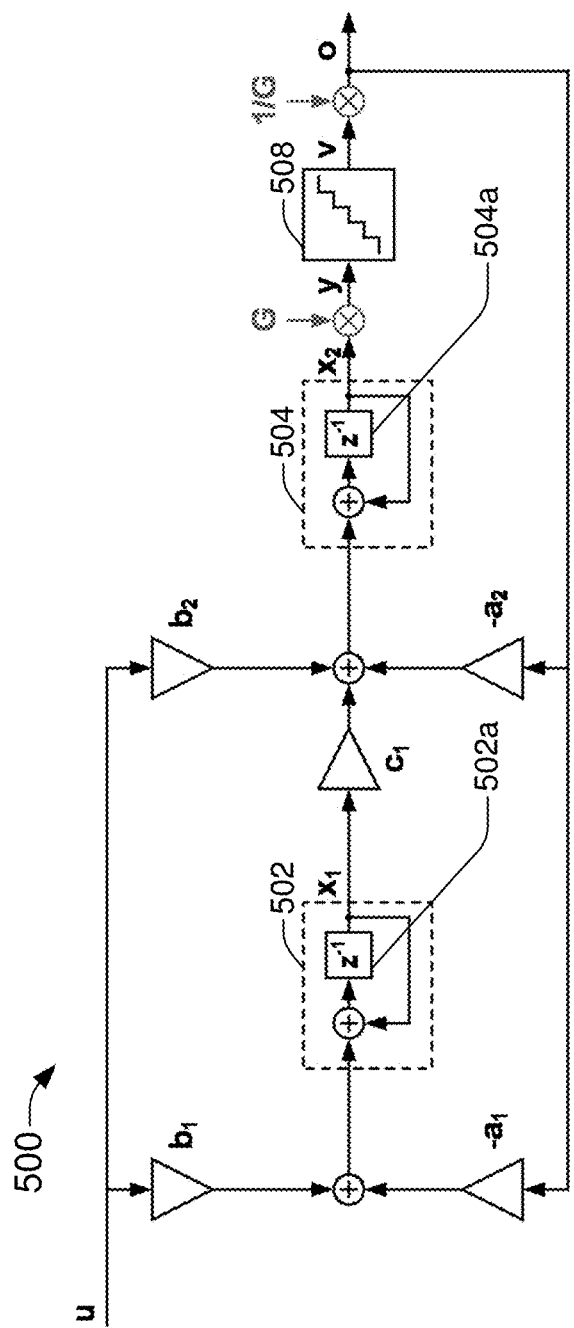
FIG. 5 depicts a first developmental step for the development of the disclosed cascade illustrates another second-order cascade of integrator feedback sigma-delta modulator, in accordance with various embodiment set forth in this disclosure.

Turning to FIG. 5, illustrated therein is an illustrative representation of a sigma-delta AGC modulator 500 that can change the resolution of a quantizer circuit 508 by changing the gain values in front of the quantizer circuit 508 and after the quantizer circuit 508, in accordance with various embodiments. In relation to sigma-delta AGC modulator 500 the operational facilities and/or functionalities can be similar to those discussed in reference to FIG. 2 and sigma-delta modulator 200. Nevertheless, the distinctions between sigma-delta modulator 200 and sigma-delta modulator 500 lies in the fact that the analog input signal (u) is not initially multiplied by a gain value (G), but rather the second integrator value ($x_2$) (e.g., more generally the input to a quantizer), prior to being conveyed to quantizer circuit 508, can be multiplied by the gain value (G), wherein the second integrator value ($x_2$) multiplied by the gain value (G), represented as value (y), is forwarded to quantizer circuit 508, whereupon quantizer circuit 508 generates quantizer output result (v). The quantizer output result (v) generated by quantizer circuit 508 can thereafter be multiplied by the inverse gain value (1/G) to produce a digital representation (o) of the input analog signal (u). It should be observed, and as is illustrated in FIG. 5, that once the quantizer output result (v) has been multiplied by the inverse gain value (1/G) to produce the digital representation (o) of the input analog signal (u), the digital representation (o) can be fed back as the first feedback coefficient ($-a_1$) and the second feedback coefficient ($-a_2$).

Additionally, review of the sigma-delta modulator 500 represented in FIG. 5 in comparison to sigma-delta modulator 200 depicted in FIG. 2, reveals that the feedback of the respective first feedback coefficient value ($-a_1$) and second feedback coefficient value ($-a_2$) is performed contemporaneously with the production of the digital representation (o) of the input analog signal (u). Nevertheless, in some implementation of the disclosed subject matter, there can be delays associated with the outputs of the DAC associated with coefficients ($-a_1$) and ($-a_2$). For example, in some instances, the first integrator circuit 502 and the second integrator circuit 504 can in alternative states, such as the first integrator circuit 502 performing a first integrator action/function and the second integrator circuit 504 performing a second integrator action/function, which can cause delays.

In relation to FIG. 5, the sigma-delta AGC modulator 500 can vary the resolution of the internal quantizer circuit 508, which generally does not have input with glitches at gain transitions because a noise transfer function (NTF) from quantizer circuit 508 input (y) to digital output signal (o) is a high-pass filter. While some low-pass filter effect can be present these effects are at very high frequencies.

Figure 6:
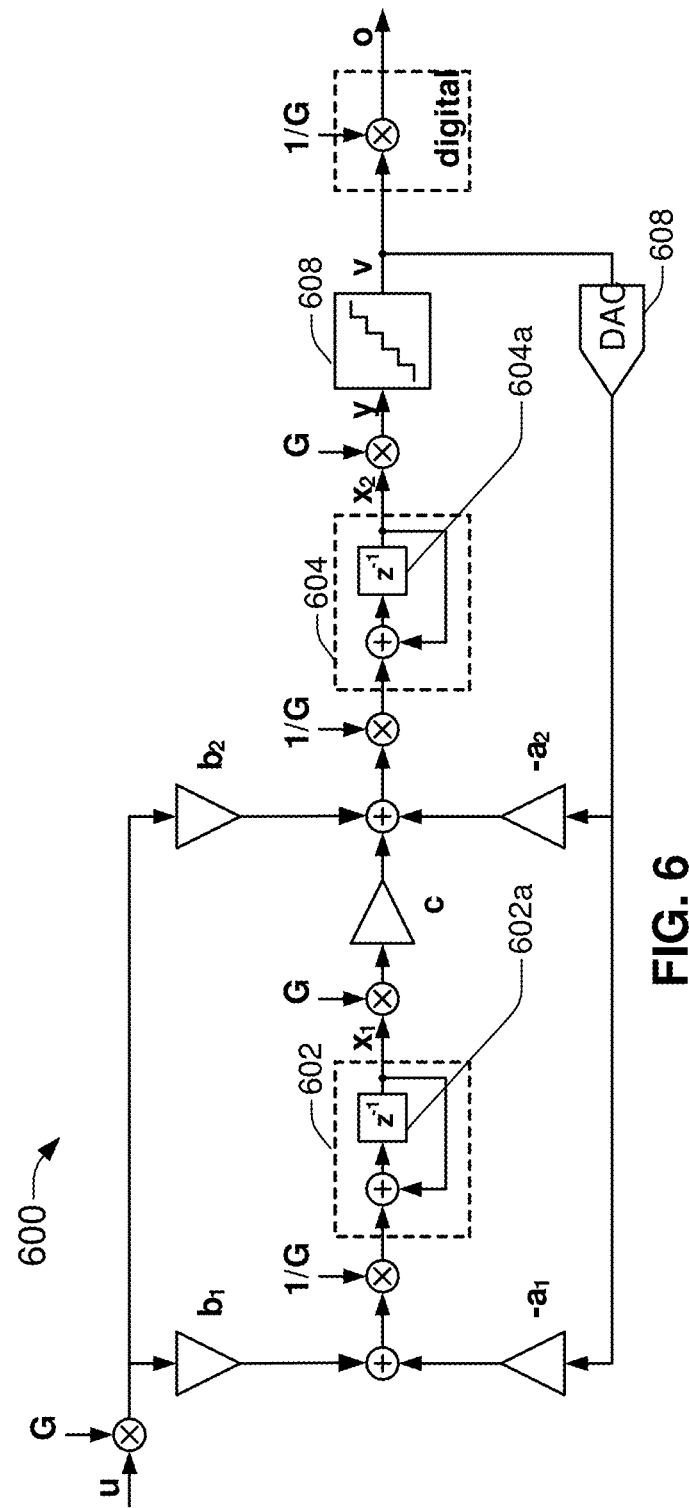
FIG. 6 depicts a second developmental step for the development of the disclosed cascade illustrates yet another second-order cascade of integrator feedback sigma-delta modulator, in accordance with various embodiments set forth in this disclosure.

Now with reference to FIG. 6, depicted therein is a further sigma-delta AGC modulator 600 that can change the resolution of a quantizer by changing the gain values in front of the quantizer and after the quantizer, in accordance with various described embodiments. The facilities and/or functionalities associated with sigma-delta AGC modulator 600 can be similar to those described earlier in relation to FIG. 5 and sigma-delta AGC modulator 500. Nonetheless, in the implementations detailed in relation to sigma-delta AGC modulator 600, it will be observed that the analog input signal (u) initially be multiplied by a gain value (G) (e.g., u×G). Thereafter, each of the first feed-forward coefficient value ($b_1$) and a second feed-forward coefficient value ($b_2$) can be multiplied by the gain value (G). The result of the multiplication of u×G with the first feed-forward coefficient value ($b_1$) can be represented as (u×G×$b_1$). Similarly, the result of the multiplication of u×G with the second feed-forward coefficient value ($b_2$) can be represented as (u×G×$b_2$). The respective operations (u×G×$b_1$) and (u×G×$b_2$) can be performed contemporaneously, and/or in near contemporaneity, with each other.

The result (u×G×$b_1$) can then be added to a first feed-back coefficient ($-a_1$) value (e.g., a first feed-back coefficient ($-a_1$) value supplied by DAC 606) and then multiplied by the inverse of the gain value (1/G), thus forming a first integrator input value that can be directed to the first integrator circuit 602.

The operations associated with the first integrator circuit 602 can be similar to those described in reference to first integrator circuit 502, and as such have been omitted for the sake of brevity of explication. Nevertheless, the output of the first integrator circuit 602 (e.g., the first integrator value ($x_1$) can be multiplied by a constant coefficient value (c), thus forming a first partial input value to be directed to a second integrator circuit 604.

As has been noted above, the multiplication of u×G with the second feed-forward coefficient value ($b_2$) can be added to a second feed-back coefficient ($-a_2$) value (e.g., a second feed-back coefficient ($-a_2$) value can also have been supplied by DAC 606) to form a second partial input value. The first partial input value and the second partial input value can then be added together, the result of the addition of the first partial input value and the second partial input value can then be multiplied by the inverse of the gain value (G), and resultant value can be directed to the second integrator circuit 608.

As with first integrator circuit 602, the functionalities and facilities associated with the second integrator circuit 604 can be similar to those described in relation to the first integrator circuit 602. Accordingly, further expositions of these earlier described aspects have been omitted.

Still with reference to FIG. 6 and sigma-delta modulator 600, the output of the second integrator circuit 604 can be a second integrator value ($x_2$) that can be multiplied by the gain value (G). The result of the multiplication of the second integrator vale ($x_2$) with the gain value (G) can yield an intermediate result (y) that can be directed to quantizer circuit 608. Quantizer circuit 608 can produce quantizer output result (v). The quantizer output result (v) can be directed to DAC 606 which can use the quantizer output result (v) generate respective first feedback coefficient values ($-a_1$) and second feedback coefficient values ($-a_2$). The quantizer output result (v) can then be multiplied by the inverse of the gain value (1/G) to provide a digital representation of the analog input signal (u) digital output signal (o).

Figure 7A:
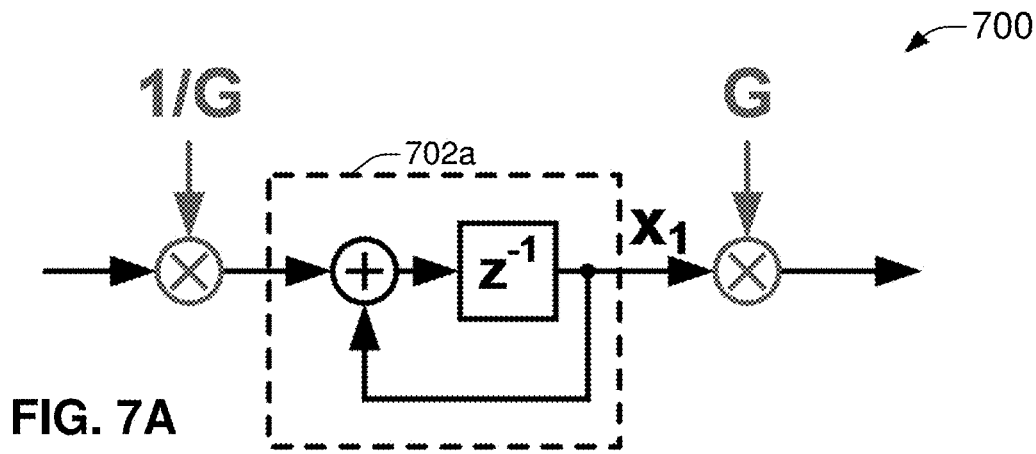
FIG. 7A depicts a further developmental step for the development of the disclosed cascade of integrator feedback sigma-delta modulator, in accordance with various embodiments set forth in this disclosure.
Figure 7B:
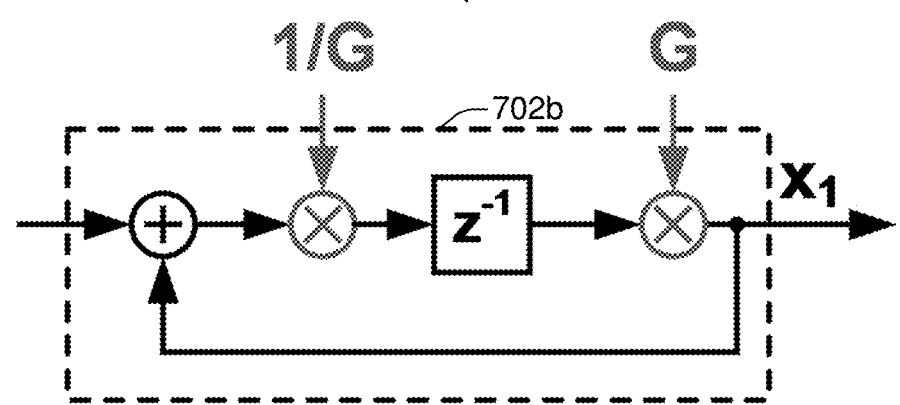
FIG. 7B illustrates another development step for the development of the cascade of integrator feedback sigma-delta modulator, in accordance with various embodiments set forth in this disclosure.
Figure 7C:
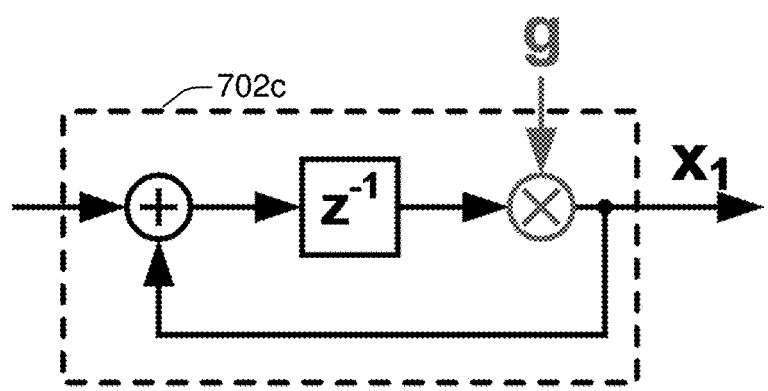
FIG. 7C depicts an additional development step for the development of the cascade of integrator feedback sigma-delta modulator, in accordance with various embodiments set forth in this disclosure.

Review and analysis, by applicant, of the one or more embodiments described in relation to sigma-delta modulators, has determined that benefits can be obtained by moving the application of gain (G) values and the application of the inverse of the gain values (1/G) inside the integrators (e.g., first integrator circuit and second integrator circuit). Analysis shows that adjusting (e.g., doubling and/or halving) state-variables at gain transitions can be sufficient. A generalized rule rendered based on the analysis appears to suggest that when gain value (G) increases, the state-variables (e.g., respective integrator output) should be multiplied by the by the factor g=G2/G1, where G1 and G2 are the values of the input gain before and after the gain change, respectively, for one clock cycle. The progression of the development of the integrator with the incorporation of the multiplier value (g) inside the integrators is illustrated in FIGS. 7A, 7B, and 7C. FIGS. 7A, and 7B illustrate the incorporation of both the gain value (G) at output of an integrator and input of the inverse gain (1/G) value at input to the integrator.

FIG. 7A provides an example depiction of an integrator circuit 700a, wherein an inverse of the gain value (1/G) can be used to multiply the incoming integrator input prior to injecting the input into the integrator circuit. Once the integrator output value ($x_1$) has emerged from the integrator circuit 700a, a gain (G) value can be applied to the integrator output value ($x_1$).

On further deliberation, in the context of FIG. 7B, applicant recognized that an improved integrator circuit 700b could be possible should the inverse of the gain value (1/G) value be applied after the addition of the determined value from a previous clock cycle to the incoming integrator input, and thereafter, prior to outputting the integrator output value ($x_1$) multiplying the foregoing result by the gain value (G).

Upon further reflection, with reference to FIG. 7C, applicant realized that a further integrator circuit 700c could be possible should the determined value that can have been determined based on values from earlier iterations of a memory element be initially added to the incoming integrator input, after which the result can be multiplied by a scaling factor (g), and then the integrator output value ($x_1$) be output from the integrator circuit.

Figure 8:
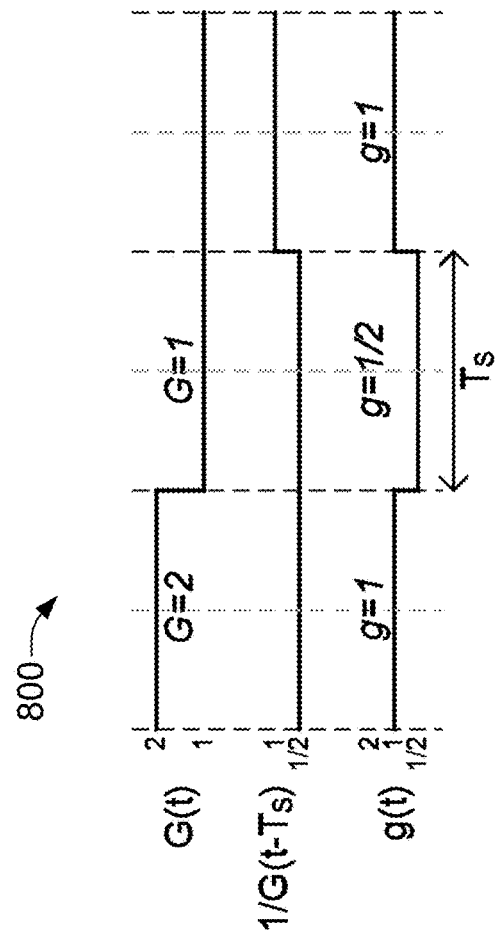
FIG. 8 depicts developmental step for the timing provides illustration of a timing diagram of the signals to be employed in conjunction with a second order cascade of integrator feedback sigma-delta modulator of FIG. 4, in accordance with embodiments set forth in this disclosure.

FIG. 8 provides a timing diagram 800 that can be used in relation to the details described in the context of FIG. 6. In particular, timing diagram 800 can be used in relation to sigma-delta AGC modulator 600.

Figure 9:
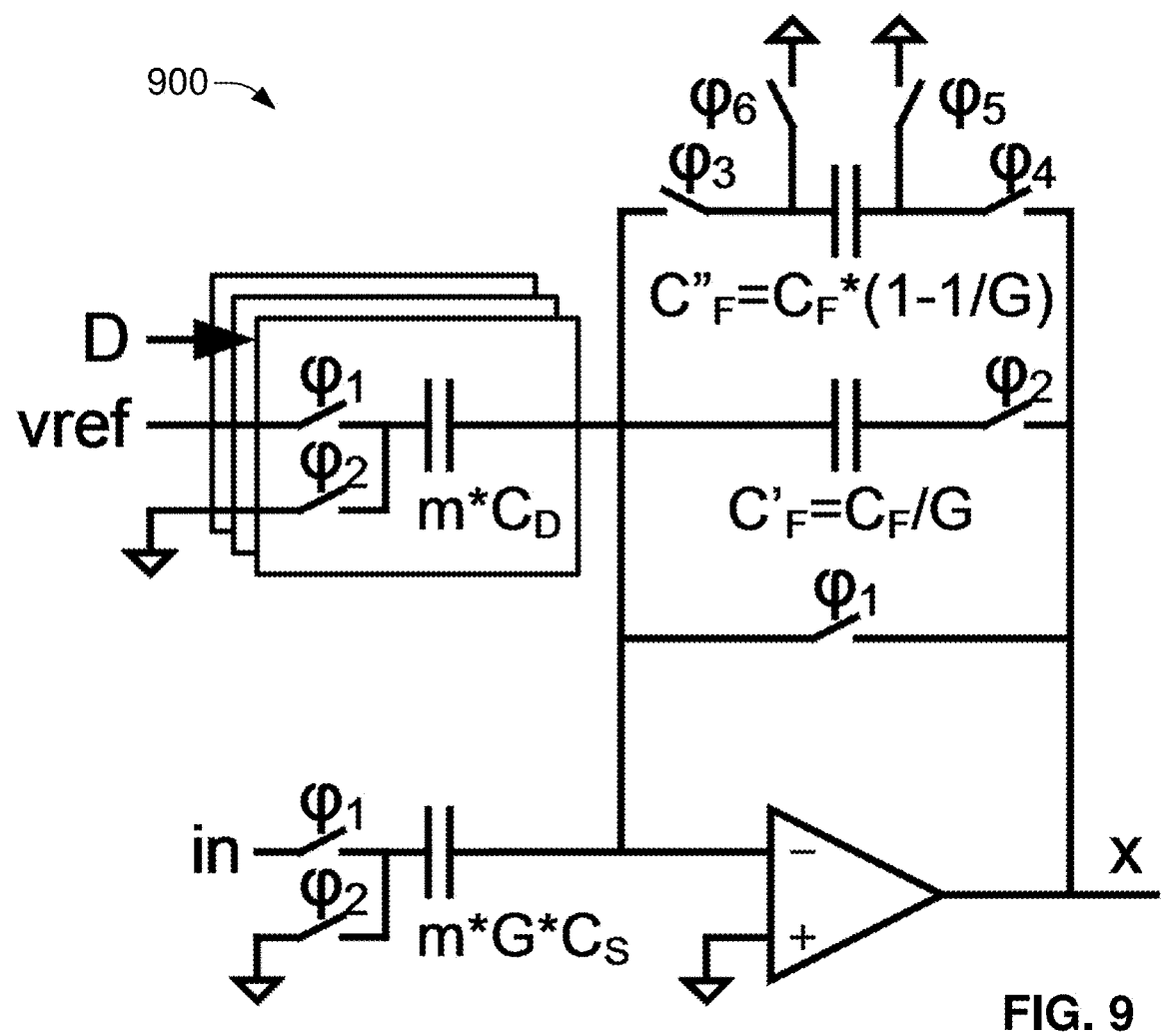
FIG. 9 provides depiction of a simplified schematic of an integrator that can have applicability in relation to a sigma-delta modulator, in accordance with one or more embodiments set forth in this disclosure.

FIG. 9 illustrates a simplified schematic of a conventional integrator, input sampling capacitor and DAC capacitor of a discrete-time (DT) sigma-delta modulator. The state variables can be implemented as the output voltage x, whose values can be stored in memory as a charge onto capacitor $C_F$. Digital signal D can be obtained from the quantizer output. A single-ended circuit 900 is shown for simplicity of illustration, but the concept can be applied also to a fully-differential structure. Note that, with respect to FIG. 10, for the second integrator of a second order sigma-delta modulator, an additional input branch (consisting of a capacitor and switches) corresponding to coefficient c, can be present and can be used to sample the output $x_1$ from a first integrator. This has been omitted here for simplicity. Moreover, it is intended that the input capacitor can be multiplied by the same coefficient m that multiplies the other input capacitors.

Figure 10:
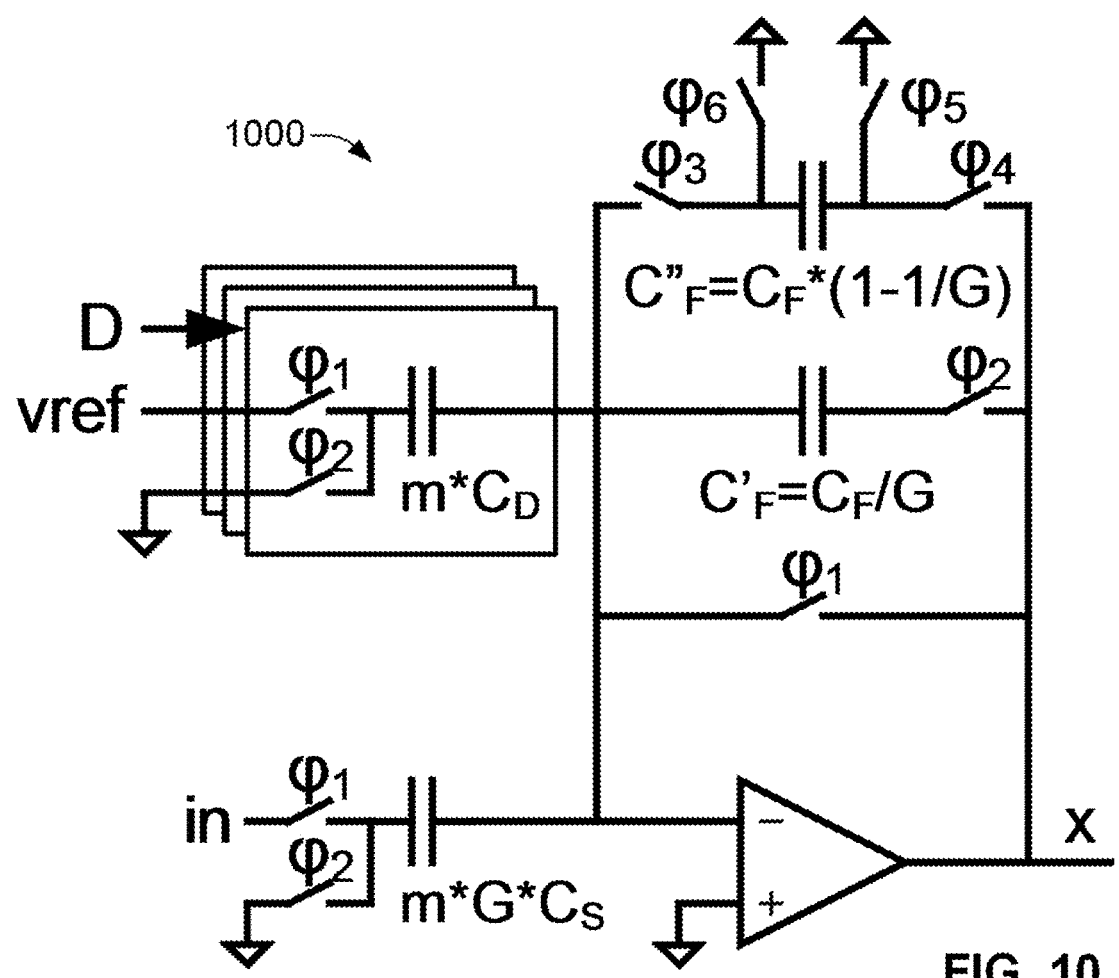
FIG. 10 provides illustration of a simplified schematic of an integrator that can have applicability in relation to a second-order cascade of integrator feedback sigma-delta modulator, in accordance with embodiments set forth in this disclosure.

With reference to FIG. 10 a simplified schematic of an integrator 1000 is illustrated. An input sampling capacitor and DAC capacitor of a DT sigma-delta modulator, modified to implement the adjustment of state-variables described herein is presented. Each capacitor can be split into a group of parts (e.g., typically two), wherein the ratio of the group of parts can be dependent on the ratio of a gain change to be applied. As illustrated, there are two equal parts for a gain of factor 2.

Figure 11:
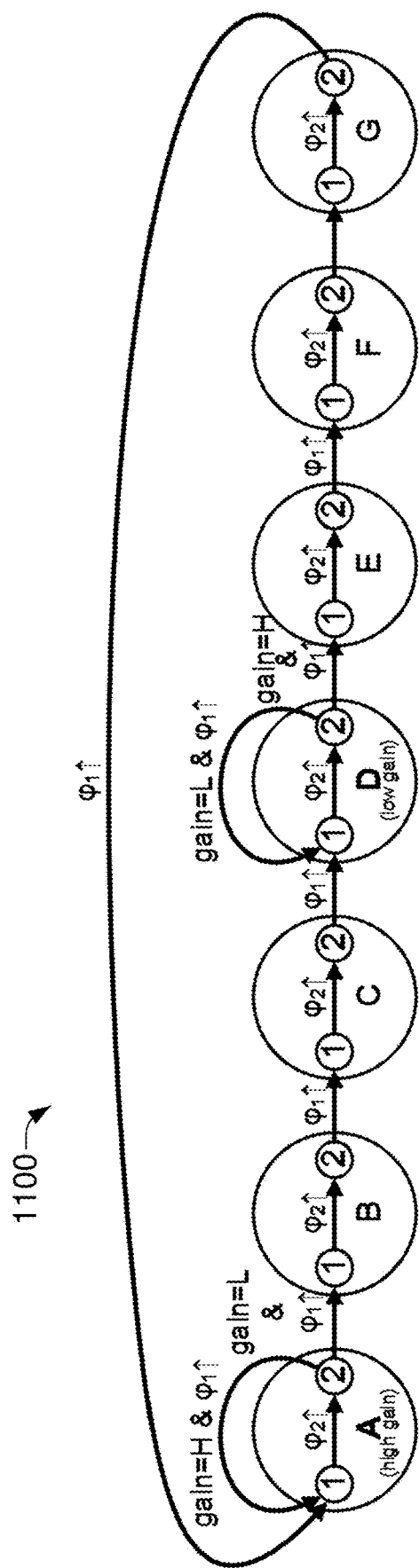
FIG. 11 provides a state transition diagram that can be used in relation to an integrator of a sigma-delta modulator, in accordance with embodiments set forth in this disclosure.

FIG. 11 provides a state transition diagram 1100 for the circuit described in relation to the integrator 1000. With reference to integrator 1000, each integrator that receives the input signal u, through feed-in coefficients b, remains in either a high gain state or low gain state, alternating between phases 1 and 2, where switch control signals $\varphi_1$ and $\varphi_2$ can be used to sample the input and DAC values onto $C_S$ and $C_D$ capacitors, during phase 1 as can be common practice in discrete-time sigma-delta modulators.

Upon a receiving a command, issued using a signal (here named "gain") that indicates the new value for the gain, a digital controller, based on a finite-state-machine, initiates a sequence of states, each lasting one clock cycle, to transition from a high-gain to a low-gain state, or vice versa.

When the transition to the new state (A or D) is completed, the state of high-gain or low-gain can be maintained until a different gain value is commanded through signal "gain." As depicted in FIG. 11, the state transition diagram 1100 can use symbols H and L to indicate, logic level high and low, respectively. Symbols $\varphi_1\uparrow$ and $\varphi_2\uparrow$ indicate that a transition to a new state and/or phase is occurring on the rising edge of signals $\varphi_1\uparrow$ and $\varphi_2\uparrow$, respectively.

Figure 12:
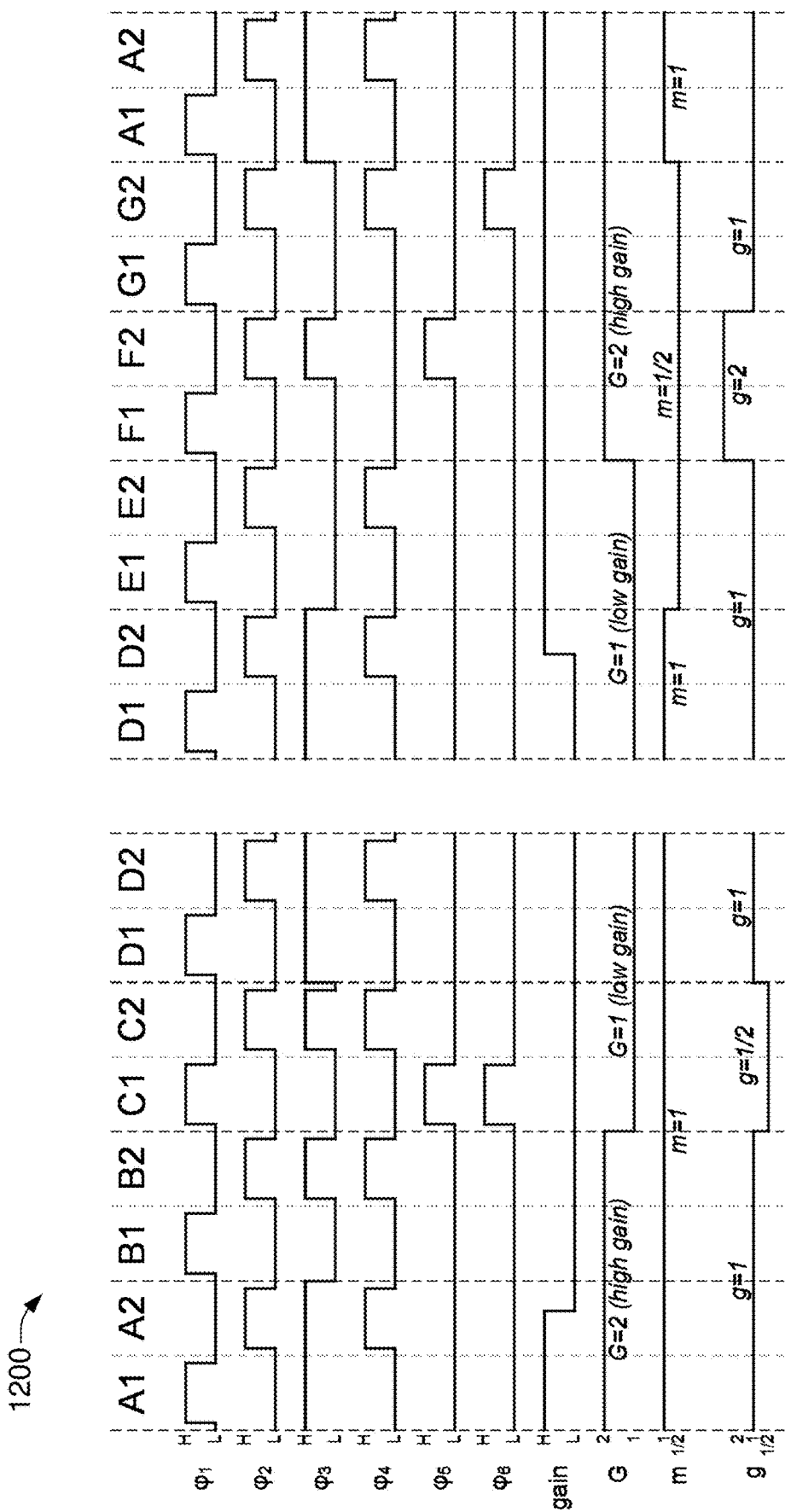
FIG. 12 provides a example timing diagram that can be used in relation to an integrator of sigma-delta modulator, in accordance with various embodiments set forth in this disclosure.

With reference to FIG. 12, depicted therein is a timing diagram 1200 for the circuit illustrated in FIG. 10. In relation to timing diagram 1200 an assumption can be made, for example, that the input gain (G) can take two values: G=G1=1 and G=G2=2.

With reference to the schematic in FIG. 10, the input capacitors, e.g., the capacitors used to sample input u, of each integrator can be multiplied by factor G. The switch associated to a control signal ($\varphi_1$ through $\varphi_6$) is ON (low resistance) when the control signal is high (H), and OFF (high resistance), when the control signal is low (L). The state variable is represented by the voltage $V_x$ of the integrator's output x.

During normal operation, in either state A or D, the full capacitance $C_F$ is utilized by connecting $C'_F$ and $C''_F$, by having $\varphi_3$=H and $\varphi_4$=$\varphi_2$ and $\varphi_5$=L and $\varphi_6$=L. When transitioning from the high-gain state (A) to the low-gain state (D), the state variable (Vx) can be reduced, by multiplying it by factor g=½ during clock cycle C. Such multiplication can be obtained by splitting the feedback capacitors $C_F$ into two parts $C'_F$ and $C''_F$, and discharging capacitor $C''_F$ during phase C1 through switches controlled by the digital signals $\varphi_5$ and $\varphi_6$.

The ratio between capacitors $C'_F$ and $C''_F$, can determine the amount of charge that can be lost and hence the factor g. For the case of this example, where $G_1/G_2=\frac{1}{2}$, $C'_F$ and $C''_F$ should have equal size. In general, $C'_F=C_F*(G_1/G_2)$ and $C''_F=C_F-C'_F=C_F*(1-G_1/G_2)$.

When transitioning from the low-gain state (D) to the high-gain state (H), the state variable (x) can be increased, by multiplying it by factor g=2 during clock cycle F. Such multiplication can be achieved by sampling the state variable $V_x$, through a capacitor, during phase E2 and injecting the corresponding charge into the feedback capacitor during phase F2.

To avoid utilizing an additional capacitor, which would entail additional circuit layout area, part of capacitor $C_F$ can be used for this purpose. To this end, a capacitor is first split into two parts, $C'_F$ and $C''_F$, with the same ratio defined above for the transition from high-gain to low-gain. Capacitor $C''_F$ can be used to sample voltage $V_x$ during E2, by having $\varphi_4$=H and $\varphi_6$=H, and $\varphi_3$=L and $\varphi_5$=L. At the end of phase E2, the charge stored on $C''_F$ can then equal to $Q'''=C''_F*V_x$, whereas the charge on $C'_F$ can be $Q'=C'_F*Vx$.

During E1 the charge can be held onto $C''_F$, by setting to OFF the switches controlled by $\varphi_3$=L and $\varphi_5$=L. During E2, the charge Q can be integrated onto $C'_F$, together with the charge from the input branches. In addition to the contributions from the input capacitors, the voltage $V_x$ is increased from $V'_x=Q'/C'_F$ to $V''_x=(Q'+Q'')/C'_F=(C'_F+C''_F)/C'_F*V'_x=C_F/C'_F*V_x=(G_2/G_1)*V'_x$, and hence by a factor $V''_x/V'_x=G_2/G_1=g$, as intended.

During the integration of input and DAC signals there is a need to preserve the same integration gain, given by $C_S/C_F$ and $C_D/C_F$, respectively, in all clock cycles. Therefore, to maintain such ratio, $C_S$ and $C_D$ can be scaled by the same ratio $m=C'_F/C_F=G_1/G_2$, when only the part of $C_F$ is used (namely $C'_F$), as needed for the operation described above. To this end, additional transition states E and G can be used.

Firstly, during state E, only fractions m of the input capacitors can be used, $m*G*C_S$ and $m*C_D$. During state F, the gain can be increased by multiplying the input sampling capacitance by factor $G=G_2$ and increasing the charge on $C'_F$, as described above. During state G, before reconnecting $C''_F$ to $C'_F$ in state A, where the full $C_F$ is utilized, the voltage $V_x$ on $C''_F$, can be copied by sampling $V_x$ during phase $G_2$, by as $\varphi_4$=H and (p=H, and $\varphi_3$=L and (p$_5$=L. In fact, if $C''_F$ were holding a different voltage than $C'_F$ before reconnection, the state variable $V_x$ would be unintentionally altered.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above-described components, devices, systems and the like, the terms (including reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified subcomponents, some of the specified components or subcomponents, and/or additional components, and according to various permutations and combinations of the foregoing. Subcomponents can also be implemented as components communicatively coupled to other components rather than included within parent components (hierarchical). Additionally, it should be noted that one or more components may be combined into a single component providing aggregate functionality or divided into several separate subcomponents, and any one or more middle layers, may be provided to communicatively couple to such subcomponents in order to provide integrated functionality. Any component described herein may also interact with one or more other components not specifically described herein.

In addition, while a particular feature of the subject disclosure may have been disclosed with respect to only one of the several implementations, such feature may be combined with one or more other features of the other implementations as may be desired and advantageous for any given or particular application. Furthermore, to the extent that the terms "includes," "including," "has," "contains," or variants thereof, and other similar words are used in either the detailed description or the claims, these terms are intended to be inclusive in a manner similar to the term "comprising" as an open transition word without precluding any additional or other elements.

What is claimed is:

1. A system, comprising:
   a sigma-delta modulator using an integrator of a cascade-of-integrator feedback topology to perform operations, comprising:
   in response to receiving a gain value, applying the gain value to a group of feed-forward coefficients and to a digital output of the sigma-delta modulator;
   determining a change in the gain value; and
   adjusting, during a clock cycle of a defined time period, a plurality of state variables of the sigma-delta modulator by multiplying each state variable of the plurality of state variables by a scale factor representing a ratio of the gain value after determining the change in the gain value and the gain value before determining the change in the gain value.

2. The system of claim 1, wherein the sigma-delta modulator is a discrete-time system.

3. The system of claim 1, wherein the integrator of the cascade-of-integrator feedback topology is implemented using switched-capacitor circuits.

4. The system of claim 3, wherein the gain value of the sigma-delta modulator is varied as a function of changing capacitor values input to switched-capacitor inputs supplied to the switched-capacitor circuits.

5. The system of claim 4, wherein the operations comprise in response to a decrease in the gain value, the plurality of state variables are reduced by the scale factor, during a single clock cycle, as a function of discharging a defined amount of charge associated with each feedback capacitors.

6. The system of claim 5, wherein the charge associated with the feedback capacitor is decreased by splitting a capacitance associated with the feedback capacitor into a first feedback capacitor and a second feedback capacitor, wherein the first feedback capacitor is discharged during the single clock cycle.

7. The system of claim 6, wherein, the operations comprise in response to an increase in the gain value, the plurality of state variables are increased by the scale factor, during a single clock cycle, as a function of increasing the charge associated with each feedback capacitors.

8. The system of claim 7, wherein the charge associated with the feedback capacitor of each integrator is increased by sampling a group of values output by the integrator of the cascade-of-integrator feedback topology, wherein a value of the group of values corresponds to the plurality of state variables, and wherein a charge proportional to a sample to the sampling of the group of values is injected to the feedback capacitor.

9. The system of claim 1, wherein an analog input signal input to the sigma-delta modulator is generated by a microelectromechanical sensor device.

10. The system of claim 1, wherein an analog input signal is input to the sigma-delta modulator is generated by a microelectromechanical microphone device.

* * * * *